(12) United States Patent
Inui (10) Patent No.: US 6,487,503 B2
(45) Date of Patent: *Nov. 26, 2002

(54) METHOD OF ESTIMATING SHAPE OF CHEMICALLY AMPLIFIED RESIST

(75) Inventor: Hirotomo Inui, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/347,824

(22) Filed: Jul. 2, 1999

(65) Prior Publication Data

US 2002/0161527 A1 Oct. 31, 2002

(30) Foreign Application Priority Data

Jul. 10, 1998 (JP) .......................... 10-195837

(51) Int. Cl.$^7$ .......................... G06F 19/00; G06F 7/60; G06F 17/50; G01B 5/00
(52) U.S. Cl. .......................... 702/22; 702/33; 702/35; 702/36; 702/81; 703/2; 703/13
(58) Field of Search ................ 395/500.05, 500.23, 395/500.34; 702/22, 33, 35, 36, 81; 703/2, 13

(56) References Cited

U.S. PATENT DOCUMENTS 6,049,660 A * 4/2000 Ahn et al. ............. 395/500.34

FOREIGN PATENT DOCUMENTS

| JP | 3-283609 | 12/1991 |
| JP | 4-044312 | 2/1992 |
| JP | 8-076348 | 3/1996 |
| JP | 8-136236 | 5/1996 |
| JP | 10-069056 | 3/1998 |

* cited by examiner

Primary Examiner—Ardin H. Marschel
(74) Attorney, Agent, or Firm—Choate, Hall & Stewart (57) ABSTRACT

A shape estimating method by which, also where a chemically amplified resist is used, the shape of the resist can be estimated accurately by a computer simulation. Diffusion of a catalyst species in a chemically amplified resist upon the post-baking process is calculated by approximation with a Gaussian distribution, and a light intensity distribution on the chemically amplified resist upon exposure to light is calculated. Then, the light intensity distribution is corrected with the calculated Gaussian distribution, and calculation of the shape of a two-dimensional pattern of the chemically amplified resist is performed based on the corrected light intensity distribution. Preferably, as the Gaussian distribution, a Gaussian distribution which approximates isotropic distribution of a catalyst species with a diffusion length used as a parameter is used.

13 Claims, 5 Drawing Sheets

METHOD OF ESTIMATING SHAPE OF CHEMICALLY AMPLIFIED RESIST

BACKGROUND OF THE INVENTION

1. Field of the Invention

This invention relates to a process simulation for simulating a manufacturing process of a semiconductor device by means of a computer, and more particularly to a method of estimating the shape of a chemically amplified resist by a computer simulation.

2. Description of the Related Art

In a simulation of a manufacturing process of a semiconductor device, that is, a process simulation, a computer is used to simulate various processes upon manufacturing of a semiconductor device such as a lithography process, an ion implantation process and a diffusion process. The shapes of various device portions, a concentration distribution of an impurity in the device, and the like can be estimated through the process simulation without actually manufacturing a semiconductor device. Particularly, in a simulation of a lithography, it is calculated what shape a photo resist after exposure and development will have when exposure using a mask pattern given in advance is performed on the photo resist applied to a semiconductor substrate.

Conventionally, as a method of calculating and estimating a two-dimensional shape of a photo resist at a high speed in the field of a lithography simulation, a method which uses calculation of a light intensity distribution on a wafer is disclosed in Burn Jen Lin, IEEE Trans. on Electron Devices, Vol. ED-27, No. 5, pp.931–938, 1980, and this method is employed popularly. In the method which uses calculation of a light intensity distribution on a wafer, light intensity distribution I(x, y) on a wafer is calculated in accordance with the following equation of Hopkins:

$$I(x, y) = \int\int S(p, q) \qquad (1)$$

$$\left|\int\int F(x_o, y_o) K(x-x_o, y-y_o) \exp\left(\frac{i2\pi}{\lambda(px_o + qy_o)}\right) dx_o dy_o\right|^2 dp\, dq$$

where x, y are two-dimensional coordinate values representative of a point on the wafer; S, which is a function representative of an effective light source, is a function representative of the intensity of light at a point (p, q) on the light source; F is a function representative of a mask transmittance at a point $(x_0, y_0)$ on the mask, K a pupil function, $\lambda$ an exposure light wavelength, i the imaginary unit ($i^2 \leq -1$), and $\pi$ the circular constant.

Pupil function K above is represented by $$K(x, y) = K_o(x, y) \exp\left(\frac{2\pi i}{\lambda} \frac{fNA^2(x^2+y^2)}{a^2}\right)$$

where f is a focus value, NA a numerical aperture, and a an aperture diameter. $K_0(x, y)$ is represented by $$K_o(x, y) = \begin{cases} 1 & [(x^2+y^2)/a^2 \leq 1] \\ 0 & [(x^2+y^2)/a^2 > 1] \end{cases}$$

Then, based on light intensity distribution I(x, y) determined in accordance with equation (1) above, a photo resist shape is calculated from a contour (isointensity line) of the light intensity distribution at light intensity threshold value $I_{th}$.

Figure 1:
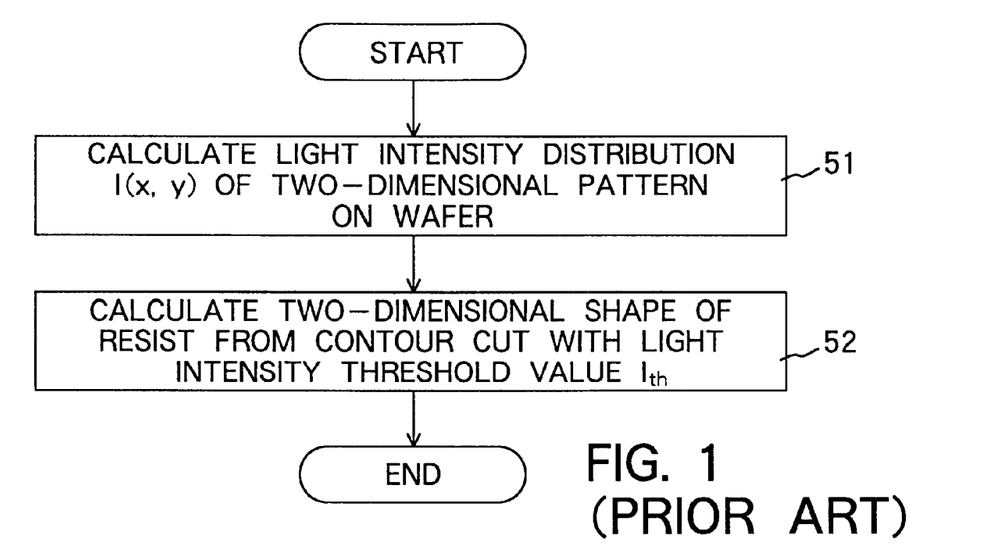
FIG. 1 is a flow chart illustrating a procedure of a conventional lithography simulation.

FIG. 1 is a flow chart illustrating a procedure of the conventional lithography simulation described above. First in step 51, light intensity distribution I(x, y) of a two-dimensional pattern on a wafer is calculated, and then in step 52, a two-dimensional resist shape is calculated from a contour obtained by cutting light intensity distribution I(x, y) at light intensity threshold value $I_{th}$.

Meanwhile, Japanese Patent Laid-Open Application No. 6-045424 (JP, 06045424, A) discloses a method wherein resolution rates of a resist corresponding to various exposure amounts are determined in advance by an experiment, and a resolution rate at each portion of the resist is determined from a result of a simulation regarding an image-formation strength of light to estimate the shape of the photo resist after development. Japanese Patent Laid-Open Application No. 6-342746 (JP, 06342736, A) discloses another method wherein an influence of reflection from a base substrate is taken into consideration to simulate the shape of a resist.

By the way, as refinement of the pattern size of a semiconductor device proceeds in recent years, the wavelength of light used for exposure becomes short, and this gives rise to such a problem that a conventional photo resist is not sufficiently high in resolution and in sensitivity. As a countermeasure for the problem, a chemically amplified resist containing a photosensitive agent (i.e., an acid generator) and a dissolution inhibitor (or a cross linking agent) has been developed. Where the resist is a positive resist, a dissolution inhibitor is used, but where the resist is a negative resist, a cross linking agent is used. In a lithography step in which a chemically amplified resist is used, a photosensitive agent is dissolved to generate acid by exposure to light, and in a later heating process (post-baking process), the acid diffuses into the resist and simultaneously a decomposition reaction of the dissolution stopping agent or a cross linking reaction of the cross linking agent by a catalytic action of the acid occurs. Where a chemically amplified resist is used, a high sensitivity can be achieved by utilizing a catalytic reaction, and since the concentration of the photosensitive agent can be reduced, the transparency is augmented and augmentation of the resolution can be achieved.

Such a conventional method described above, however, is disadvantageous in that, when a shape of such a chemically amplified resist as described above is simulated, since an influence of acid diffusion upon the post-baking process is not taken into consideration, the calculation accuracy of a shape is low particularly when the type of the photo resist changes.

SUMMARY OF THE INVENTION

It is an object of the present invention to provide a shape estimating method by which, also where a chemically amplified resist is used, the shape of the resist can be estimated accurately by a simulation.

The object of the present invention described above is achieved by a method for estimating a shape of a chemically amplified resist by a computer simulation, comprising the steps of calculating diffusion of a catalyst species in the chemically amplified resist upon a post-baking process by approximation with a Gaussian distribution, calculating a light intensity distribution on the chemically amplified resist upon exposure to light, correcting the light intensity distribution with the Gaussian distribution, and performing calculation of the shape of a two-dimensional pattern of the chemically amplified resist based on the corrected light intensity distribution.

Here, the catalyst species typically is an acid which acts as a catalyst upon a dissolution stopping agent or cross linking agent upon the post-baking process of the chemically amplified resist.

In particular, in the present invention, it is assumed that a catalyst species such as an acid diffuses isotropically in the resist, and this isotropic diffusion is approximated with a Gaussian distribution. A two-dimensional isotropic Gaussian distribution is preferably used as the Gaussian distribution approximating the diffusion process of the catalyst species. Such a Gaussian distribution is characterized by a single parameter representative of a degree of broadening of the distribution except two-dimensional coordinates of the position of a maximal point. Here, this single parameter is set to diffusion length dl. Diffusion length dl is a parameter which depends upon the type of the chemically amplified resist, the time of the post-baking process, the temperature and so forth, and preferably, diffusion length dl is determined in advance based on actual measurements.

Further, in the present invention, if optical proximity effect correction (OPC) is performed, then the correction of the mask pattern, the calculation of the light intensity distribution based on the corrected mask pattern and the correction of the calculated light intensity distribution with the Gaussian distribution should be repeated until a desired resist pattern shape is obtained.

According to the present invention, since, when a simulation of a lithography process is performed, a distribution of a diffusion species is approximated with a Gaussian distribution based on measurement data of dimension linearity of a one-dimensional L/S (line-and-space) pattern of a chemically amplified resist and/or like data and the light intensity distribution on the resist is corrected with the Gaussian distribution and then shape distribution of a two-dimensional pattern is performed based on the corrected light intensity distribution, also where a chemically amplified resist is used, a photo resist shape can be determined with a high degree of accuracy.

The above and other objects, features, and advantages of the present invention will become apparent from the following description referring to the accompanying drawings which illustrate examples of the preferred embodiments of the present invention.

DESCRIPTION OF THE PREFERRED EMBODIMENT

Figure 2:
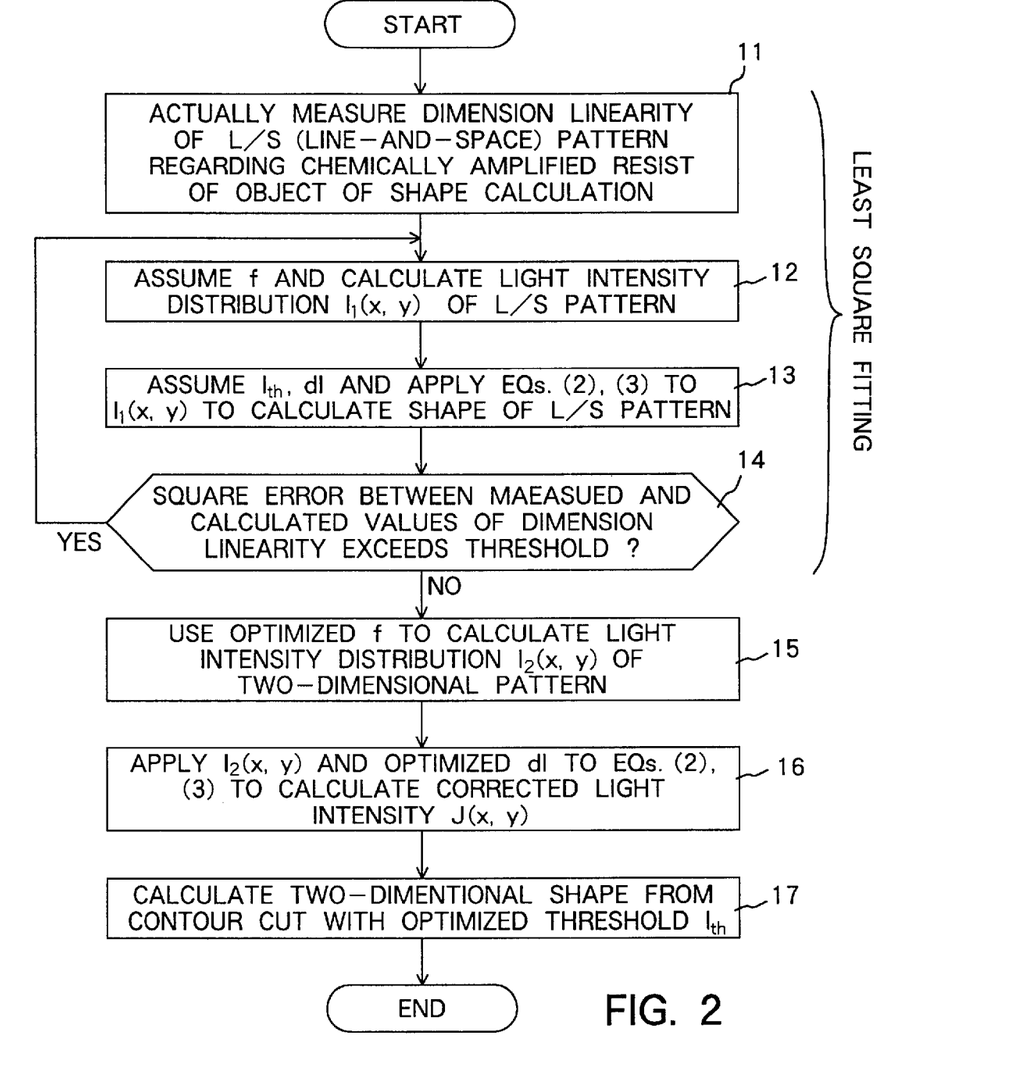
FIG. 2 is a flow chart illustrating a procedure of a simulation according to a preferred embodiment of the present invention.

A procedure of estimating the shape of a chemically amplified resist by a lithography simulation of a preferred embodiment of the present invention is described with reference to FIG. 2. First, a basic principle of the simulation here is described.

As described above, in a lithography process in which a chemically amplified resist is used, acid is produced in the resist upon exposure to light, and by a later heat treatment (i.e., post-baking process) the acid is dispersed and a reaction of a dissolution inhibitor (or cross linking agent) by a catalytic action of the acid occurs simultaneously. In the present embodiment, upon simulation, an effect of acid diffusion upon post-baking is approximated with a two-dimensional Gaussian distribution with the acid diffusion regarded as isotropic diffusion. Here, the distribution of the acid immediately after the exposure (before post-baking is performed) can be approximated with light intensity distribution I(x, y) upon exposure. This light intensity distribution I(x, y) can be calculated, for example, in accordance with the equation of Hopkins given as equation (1) above.

Meanwhile, the diffusion of the acid upon post-baking is approximated with Gaussian distribution G(x', y') given as equation (2) below. A method of determining diffusion length dl is hereinafter described.

$$G(x', y') = \frac{1}{2\pi dl^2} \exp\left(\frac{-(x'^2 + y'^2)}{2dl^2}\right) \quad (2)$$

Consequently, the diffusion of the acid upon post-baking is light intensity distribution I(x, y) corrected with the Gaussian distribution described above, and the thus corrected diffusion is referred to as corrected light intensity J(x, y). Corrected light intensity J(x, y) is represented by a convolution integration of light intensity distribution I(x, y) and Gaussian distribution G(x', y') as given by equation (3) below.

$$J(x, y) = \int\int I(x-x', y-y')G(x', y')dx'dy' \quad (3)$$

Since corrected light intensity J(x, y) determined in this manner increases in proportion to the exposure dependency of the photo resist shape, a contour of corrected light intensity J(x, y) at arbitrary threshold value $I_{th}$ is given as a photo resist shape at the corresponding exposure amount.

Now, a method of determination of diffusion length dl is described. Diffusion length dl is preferably determined in advance based on actual measurements, particularly it may be determined by a method such as least square fitting from measurement data of dimension linearity obtained by plotting variations of finish dimensions after exposure when the designed dimensions of lines and spaces of a one-dimensional line-and-space (L/S) pattern are varied. If diffusion length dl is determined once, then unless the type of the resist is changed or an exposure condition or a post-backing condition is changed, diffusion length dl determined already can be continuously used as it is. Further, since an increase of the resist film thickness has an effect to cause defocusing to deform an optical image, upon the fitting of diffusion length dl, fitting of focus value f is preferably performed with the effect of the defocusing taken into consideration.

By employing such a procedure as described above, a lithography simulation in which an effect of an acid diffusion reaction of a chemically amplified resist and an effect of defocusing by a photo resist film thickness are taken into consideration is performed, and consequently, a photo resist shape can be calculated with a much higher degree of accuracy than ever.

Now, a detailed procedure is described with reference to FIG. 2. Here, when diffusion length dl is determined by least square fitting, also an optimized value of focus value f is determined simultaneously. However, if defocusing is not taken into consideration, then only diffusion length dl may be determined by least square fitting.

First in step 11, a chemically amplified resist applied to a semiconductor substrate is actually exposed to light of a one-dimensional line-and-space (L/S) pattern while the designed dimensions of lines and spaces are successively varied to measure dimension linearity of the L/S pattern.

Then, in order to perform least square fitting, in step 12, focus value f is assumed based on the mask pattern used for the exposure of the L/S pattern in step 11, and the equation of Hopkins (equation (1)) given hereinabove or the like is used to calculate light intensity distribution $I_1(x, y)$ with the resist used upon the exposure of the L/S pattern, which is necessary for calculation of the dimension linearity. Then in step 13, light intensity threshold value Ith and diffusion length dl are assumed and the Gaussian distribution is determined in accordance with equation (2) based on thus assumed diffusion length dl, and light intensity distribution $I_1(x, y)$ determined in step 12 is substituted into equation (3) to calculate the convolution integration of equation (3) by a fast Fourier transform algorithm to determine corrected light intensity $J(x, y)$. Then, the shape of the L/S pattern based on corrected light intensity $J(x, y)$ is determined, and dimension linearity is calculated. In step 14, a square error between the dimension linearity data determined by the calculation in step 13 and the dimension linearity data actually measured in step 11 is determined, and it is discriminated whether or not the square error is equal to or lower than a predetermined threshold value. If the square error does not exceed the threshold value, then it is determined that optimization of light intensity threshold value $I_{th}$, diffusion length dl and focus value f is completed, and the control advances to next step 15. However, if the square error is larger than the threshold value, then the control returns to step 12 in order to repeat the processing described above while light intensity threshold value $I_{th}$, diffusion length dl and focus value f are successively varied little by little. By repeating steps 12 to 14 described above, least square fitting of light intensity threshold value $I_{th}$, diffusion length dl and focus value f is performed.

After the optimization of light intensity threshold value $I_{th}$, diffusion length dl and focus value f is completed, optimized focus value f is used, in step 15, to calculate light intensity distribution $I_2(x, y)$ of a two-dimensional pattern in accordance with equation (1) based on a mask pattern which is an object of the simulation. Then, light intensity distribution $I_2(x, y)$ and optimized diffusion length dl are used to calculate corrected light intensity $J(x, y)$ in accordance with equations (2) and (3) in step 16. Further in step 17, a contour of corrected light intensity $J(x, y)$ at optimized light intensity threshold value $I_{th}$ is determined and decided as a two-dimensional shape of the resist in step 17.

By the processing described above, a lithographic simulation in which acid diffusion of a chemically amplified resist upon post-baking and defocusing by a photo resist film thickness are taken into consideration is performed, and the shape of the resist is calculated with a higher degree of accuracy than that by the conventional method.

Figure 3:
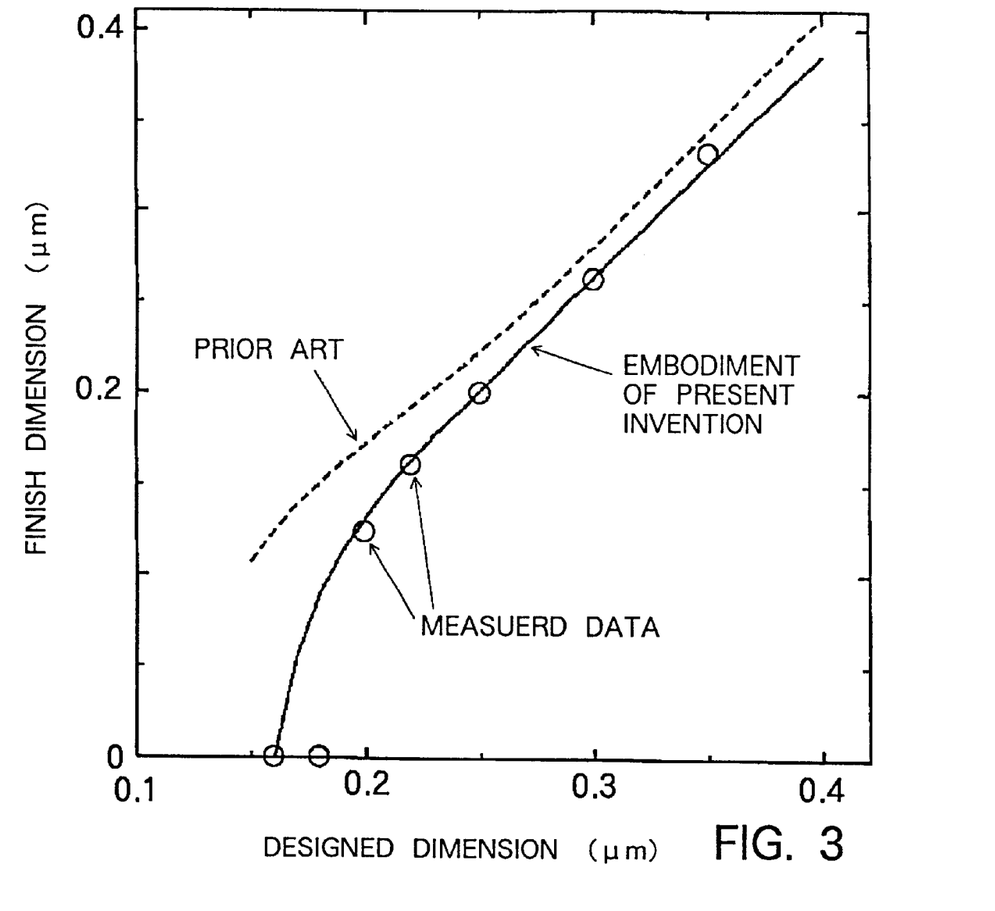
FIG. 3 is a graph showing an example of a dimension linearity curve of a chemically amplified resist.

FIG. 3 is a graph illustrating a fitting result of a dimension linearity curve of a chemically amplified resist by a least squire method. Referring to FIG. 3, a solid line curve represents a result based on the embodiment of the present invention described above, and a broken line curve represents a result based on the conventional method. Further, the open circle mark represents measurement data. As can be seen apparently from FIG. 3, according to the method of the present embodiment, the accuracy in dimension exhibited augmentation of approximately 30% when compared with that by the conventional method. Further, calculation of a two-dimensional shape of a photo resist wherein diffusion length dl and focus value f obtained from the fitting proved that an augmentation of the accuracy in dimension by more than 30% than that by the conventional method was exhibited.

While, in the procedure described above, no correction of an optical proximity effect (OPE) is performed, in the present invention, optical proximity effect correction (OPC) may be performed.

Figure 4:
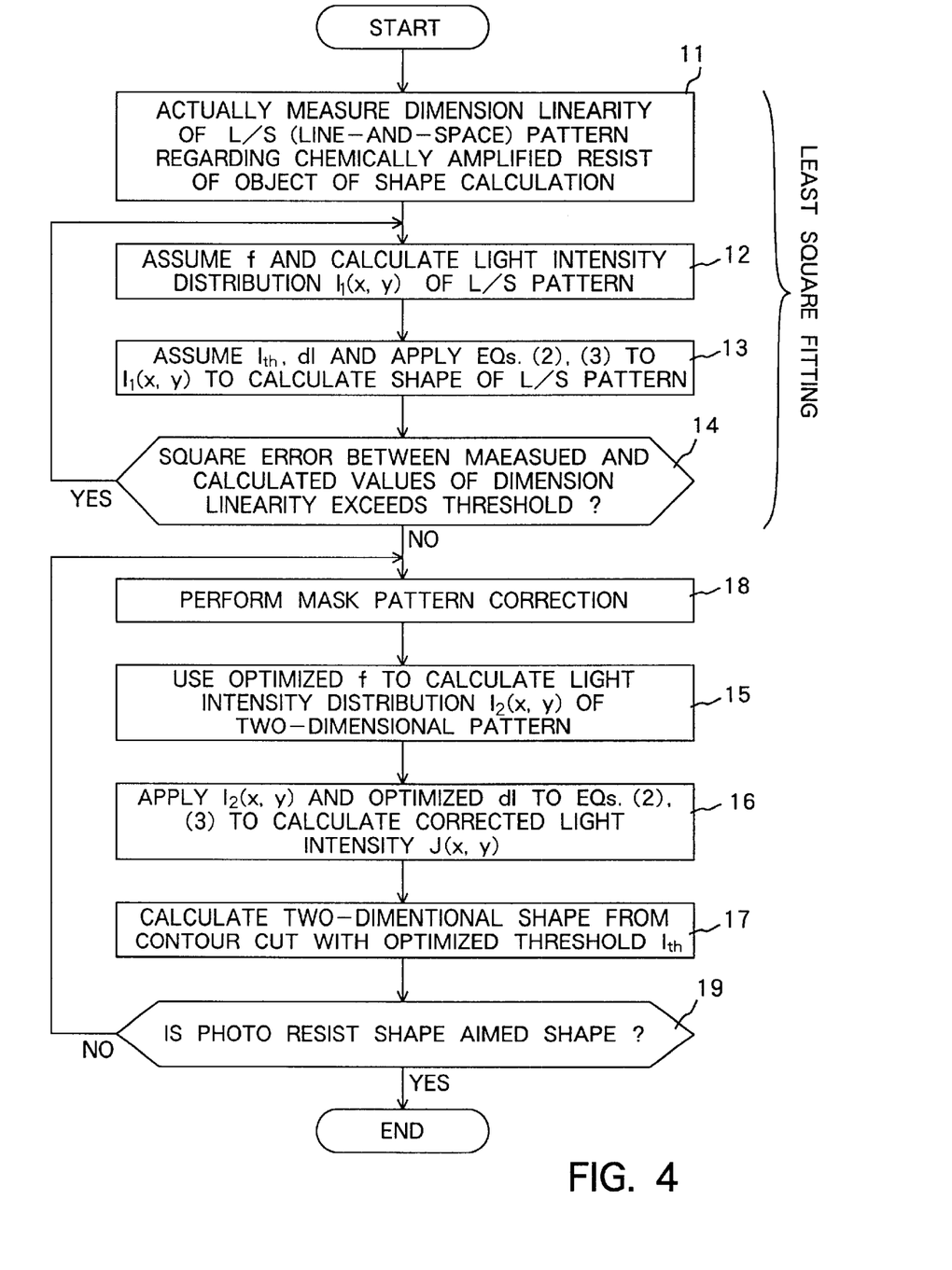
FIG. 4 is a flow chart illustrating a procedure of a simulation in which optical proximity effect correction is performed.

FIG. 4 illustrates a simulation procedure wherein optical proximity effect correction is performed. In the present procedure, after steps 11 to 14 of the procedure illustrated in FIG. 2 are executed to perform optimization of light intensity threshold value $I_{th}$, diffusion length dl and focus value f, mask pattern correction is performed in step 18. Thereafter, steps 15 to 17 of the procedure illustrated in FIG. 2 are executed. Then, it is discriminated in step 19 whether or not the resulting photo resist shape is an aimed one. If it is detected that the aimed shape is obtained, then the processing is ended. If the aimed shape is not obtained in step 19, then the control returns to step 18 to execute the mask pattern correction again to repeat the processing in steps 15 to 17. By performing the processing illustrated in FIG. 4, also where optical proximity effect correction is performed, a lithography simulation wherein acid diffusion of a chemically amplified resist upon post-baking and defocusing by a photo resist film thickness are taken into consideration can be executed, and a resist shape can be calculated with a high degree of accuracy.

Figure 5:
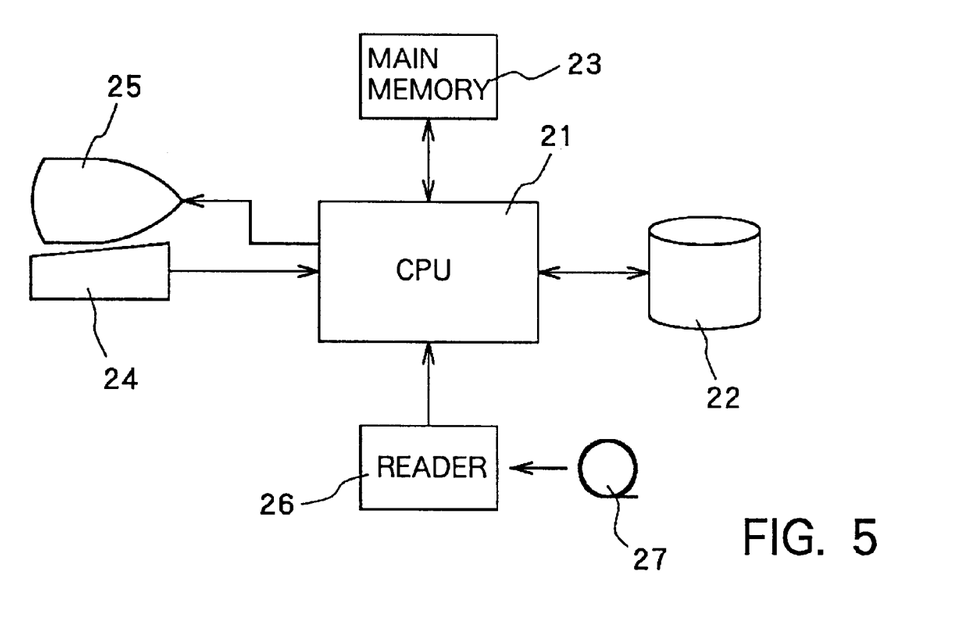
FIG. 5 is a block diagram showing a construction of a computer system for performing a lithography simulation.

The lithography simulation described above is executed by causing a computer such as a supercomputer or an engineering work station (EWS) to read in a computer program for implementation of the lithography simulation and execute the program. The program (lithography simulator) for performing the lithography simulation is read into the computer from a recording medium such as a magnetic tape or a CD-ROM. FIG. 5 is a block diagram showing a construction of a computer system used to execute the lithography simulation described above.

Referring to FIG. 5, the computer system shown includes CPU (central processing unit) 21, hard disk drive 22 for storing a program and data, main memory 23, inputting apparatus 24 such as a keyboard or a mouse, display unit 25 such as a CRT, and reading apparatus 26 for reading recording medium 27 such as a magnetic tape or a CD-ROM. Hard disk drive 22, main memory 23, inputting apparatus 24, display unit 25 and reading apparatus 26 are all connected to CPU 21. In this computer, recording medium 27 on which the program for performing the lithography simulation is stored is loaded into reading apparatus 26, and the program is read out from recording medium 27 and stored into hard disk drive 22. Then, the program stored in hard disk drive 22 is executed by CPU 21 to execute a lithography simulation.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A method for estimating a shape of a chemically amplified resist by a computer simulation, comprising the steps of:

calculating diffusion of a catalyst species in the chemically amplified resist upon post-baking process by approximation with a Gaussian distribution $G(x', y')$, represented as:

$$G(x', y') = (1/(2\pi dl^2))\exp(-(x'^2+y'^2)/(2dl^2)),$$

wherein dl is a diffusion length;

calculating a light intensity distribution on the chemically amplified resist upon exposure to light wherein said light intensity distribution, I(x,y) is calculated in accordance with:

$$I(x,y)=\iint (p, q)[\iint F(xo, yo)K(x-xo, y-yo)\exp((i2\pi)/\lambda(pxo+qyo))dxo\, dyo\,]^2 dpdq$$

where x and y are two-dimensional coordinate values representative of a point on a wafer, S, which is a function representative of an effective light source, is a function representative of an intensity of light at a point (p,q) on the light source, F is a function representative of a mask transmittance at a point (xo, yo) on the mask, K is a pupil function, $\lambda$ an exposure light wavelength, i an imaginary unit such that $i^2=-1$, and $\pi$ is a circular constant, said pupil function K being represented as:

$$K(x,y)=Ko(x,y)\exp((2\pi i f NA^2(x^2+y^2))/(\lambda a^2))$$

where f is a focus value, NA a numerical aperture, a an aperture diameter, with Ko(x,y) being 2 if $(x^2+y^2)/a^2$ is less than or equal to 1 and 0 otherwise;

correcting the light intensity distribution with the Gaussian distribution producing a corrected light intensity J(x,y) formed by a convolution integration of light intensity distribution I(x,y) represented by:

$$J(x,y)=\iint I(x-x', y-y')G(x', y')dx'dy';$$

and performing calculation of the shape of a two-dimensional pattern of the chemically amplified resist based on the corrected light intensity distribution J(x,y) at arbitrary threshold value Ith.

2. A method according to claim 1, wherein the Gaussian distribution is characterized by a single parameter that represents a degree of broadening of the distribution, and where the Gaussian distribution approximates isotropic diffusion of the catalyst species with a diffusion length used as the single parameter.

3. A method for estimating a shape of a chemically amplified resist by a computer simulation, comprising the steps of:

calculating diffusion of a catalyst species in the chemically amplified resist upon post-baking process by approximation with a Gaussian distribution G(x', y'), represented as:

$$G(x', y')=(1/(2\pi dl^2))\exp(-(x'^2+y'^2)/(2dl^2))$$

wherein dl is a diffusion length;

calculating a light intensity distribution on the chemically amplified resist upon the exposure to light when a mask pattern of a simulation object is used wherein said light intensity distribution, I(x,y) is calculated in accordance with:

$$I(x,y)=\iint S(p, q)[\iint F(xo, yo)K(x-xo, y-yo)\exp((i2\pi)/\lambda(pxo+qyo))dxo\, dyo]^2 dpdq$$

where x and y are two-dimensional coordinate values representative of a point on a wafer, S, which is a function representative of an effective light source, is a function representative of an intensity of light at a point (p,q) on the light source, F is a function representative of a mask transmittance at a point (xo, yo) on the mask, K is a pupil function, $\lambda$ an exposure light wavelength, i an imaginary unit such that $i^2=-1$, and $\pi$ is a circular constant, said pupil function K being represented as:

$$K(x,y)=Ko(x,y)\exp((2\pi i f NA^2(x^2+y^2))/(\lambda a^2))$$

where f is a focus value, NA a numerical aperture, a an aperture diameter, with Ko(x,y) being 1 if $(x^2+y^2)/a^2$ is less than or equal to 1 and 0 otherwise;

correcting the light intensity distribution with the Gaussian distribution producing a corrected light intensity J(x,y) formed by a convolution integration of light intensity distribution I(x,y) represented by:

$$J(x,y)=\iint I(x-x', y-y')G(x', y')dx'dy';$$

calculating a shape of a two-dimensional pattern of the chemically amplified resist based on the corrected light intensity distribution J(x,y) at arbitrary threshold value Ith; and repeating the calculation of the light intensity distribution, the correction of the light intensity distribution and the calculation of the shape of the two-dimensional pattern while the mask pattern is corrected until the two-dimensional pattern obtained by the calculation of the shape becomes a desired shape.

4. A method according to claim 3, wherein the Gaussian distribution is characterized by a single parameter that represents a degree of broadening of the distribution, and where the Gaussian distribution approximates isotropic diffusion of the catalyst species with a diffusion length used as the single parameter.

5. A method according to claim 1, further comprising the step of correcting focus displacement which arises from a film thickness of the chemically amplified resist.

6. A method according to claim 3, further comprising the step of correcting focus displacement which arises from a film thickness of the chemically amplified resist.

7. A recording medium which stores a program for estimating a shape of a chemically amplified resist by a computer simulation and is readable by a computer, said program causing said computer to execute the steps of:

calculating diffusion of a catalyst species in the chemically amplified resist upon post-baking process by approximation with a Gaussian distribution G(x', y'), represented as:

$$G(x', y')=(1/(2\pi dl^2))\exp(-(x'^2+y'^2)/(2dl^2))$$

wherein dl is a diffusion length;

calculating a light intensity distribution on the chemically amplified resist upon exposure to light wherein said light intensity distribution, I(x,y) is calculated in accordance with:

$$I(x,y)=\iint S(p, q)[\iint F(xo, yo)K(x-xo, y-yo)\exp((i2\pi)/\lambda(pxo+qyo))dxo\, dyo]^2 dpdq$$

where x and y are two-dimensional coordinate values representative of a point on a wafer, S, which is a function representative of an effective light source, is a function representative of an intensity of light at a point (p,q) on the light source, F is a function representative of a mask transmittance at a point (xo, yo) on the mask, K is a pupil function, λ an exposure light wavelength, i an imaginary unit such that $i^2=-1$, and π is a circular constant, said pupil function K being represented as:

$$K(x,y)=Ko(x,y)\exp((2\pi ifNA^2(x^2+y^2))/(\lambda a^2))$$

where f is a focus value, NA a numerical aperture, a an aperture diameter, with Ko(x,y) being 1 if $(x^2+y^2)/a^2$ is less than or equal to 1 and 0 otherwise;

correcting the light intensity distribution with the Gaussian distribution producing a corrected light intensity J(x,y) formed by a convolution integration of light intensity distribution I(x,y) represented by:

$$J(x,y)=\int\int I(x-x', y-y')G(x', y')dx'dy';$$

performing calculation of the shape of a two-dimensional pattern of the chemically amplified resist based on the corrected light intensity distribution J(x,y) at arbitrary threshold value Ith; and correcting focus displacement arising from a film thickness of the chemically amplified resist.

8. A recording medium which stored a program estimating a shape of a chemically amplified resist by a computer simulation and is readable by a computer, said program causing said computer to execute the steps of:

calculating diffusion of a catalyst species in the chemically amplified resist upon a post-baking process by approximation with a Gaussian distribution G(x', y'), represented as:

$$G(x', y')=(1/(2\pi dl^2))\exp(-(x'^2+y'^2)/(2dl^2))$$

wherein dl is a diffusion length;

calculating a light intensity distribution on the chemically amplified resist upon the exposure of light when a mask pattern of a simulation object is used wherein said light intensity distribution, I(x,y) is calculated in accordance with:

$$I(x,y)=\int\int S(p, q)[\int\int F(xo, yo)K(x-xo, y-yo)\exp((i2\pi)/\lambda(pxo+qyo-))dxo\ dyo]^2dpdq$$

where x and y are two-dimensional coordinate values representative of a point on a wafer, S, which is a function representative of an effective light source, is a function representative of an intensity of light at a point (p,q) on the light source, F is a function representative of a mask transmittance at a point (xo, yo) on the mask, K is a pupil function, λ an exposure light wavelength, i an imaginary unit such that $i^2=1$, and π is a circular constant, said pupil function K being represented as:

$$K(x,y)=Ko(x,y)\exp((2\pi ifNA^2(x^2+y^2))/(\lambda a^2))$$

where f is a focus value, NA a numerical aperture, a an aperture diameter, with Ko(x,y) being 1 if $(x^2+y_2)/a^2$ is less than or equal to 1 and 0 otherwise;

correcting the light intensity distribution with the calculated Gaussian distribution producing a corrected light intensity J(x,y) formed by a convolution integration of light intensity distribution I(x,y) represented by:

$$J(x,y)=\int\int I(x-x', y-y')G(x', y')dx'dy';$$

calculating a shape of a two-dimensional pattern of the chemically amplified resist based on the corrected light intensity distribution J(x,y) at arbitrary threshold value Ith; and repeating the calculation of the light intensity distribution, the correction of the light intensity distribution and the calculation of the shape of the two-dimensional pattern while the mask patter is corrected until the two-dimensional pattern obtained by the calculation of the shape becomes a desired shape.

9. A computerized method of estimating a shape of a chemically amplified photoresist, comprising the steps of: calculating an uncorrected light intensity distribution on the chemically amplified photoresist upon exposure to light energy of at least a predetermined exposing energy wherein said light intensity distribution, I(x,y) is calculated in accordance with:

$$I(x,y)=\int\int S(p, q)[\int\int F(xo, yo)K(x-xo, y-yo)\exp((i2\pi)/\lambda(pxo+qyo-))dxo\ dyo]^2dpdq$$

where x and y are two-dimensional coordinate values representative of a point on a wafer, S, which is a function representative of an effective light source, is a function representative of an intensity of light at a point (p,q) on the light source, F is a function representative of a mask transmittance at a point (xo, yo) on the mask, K is a pupil function, λ an exposure light wavelength, i an imaginary unit such that $i^2=-1$, and π is a circular constant, said pupil function K being represented as:

$$K(x,y)=Ko(x,y)\exp((2\pi ifNA^2(x^2+y^2))/(\lambda a^2))$$

where f is a focus value, NA a numerical aperture, a an aperture diameter, with Ko(x,y) being 1 if $(x^2+y_2)/a^2$ is less than or equal to 1 and 0 otherwise;

calculating a two dimensional Gaussian distribution of a catalyst species in the chemically amplified photoresist upon a post-baking process, including a least squares fit of linear line and space patterns, wherein the Gaussian distribution is described using a single value of a distribution broadening parameter;

correcting the uncorrected light intensity distribution to calculate a corrected light intensity distribution using a convolution integration method with the distribution broadening parameter of the Gaussian distribution, G(x'y'), producing a corrected light intensity J(x,y) formed by a convolution integration of light intensity distribution I(x,y) represented by:

$$J(x,y)=\int\int I(x-x', y-y')G(x', y')dx'dy';$$

and calculating the shape of the photoresist using the corrected light intensity distribution J(x,y) at arbitrary threshold value Ith.

10. The method according to claim 9, wherein the distribution broadening parameter is the diffusion length.

11. The method according to claim 10, wherein a fast Fourier transform method is used to calculate the diffusion length from the linear line and space patterns of a photoresist having a selected photoresist film thickness and a selected post-bake temperature and time process.

12. The method according to claim 11, further comprising the step of calculating a set of two dimensional focus displacement values for correcting the shape of the photoresist depending upon the local thickness of the photoresist.

13. The method according to claim 12, further comprising the step of calculating a set of two dimensional substrate reflection values for correcting the shape of the photoresist depending upon the local light reflections of the photoresist substrate.

* * * * *